(12) United States Patent
Fujiwara (10) Patent No.: US 6,724,049 B2
(45) Date of Patent: *Apr. 20, 2004

(54) SOI SEMICONDUCTOR DEVICE WITH INSULATING FILM HAVING DIFFERENT PROPERTIES RELATIVE TO THE BURIED INSULATING FILM

(75) Inventor: Makoto Fujiwara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/287,508

(22) Filed: Nov. 5, 2002

(65) Prior Publication Data

US 2003/0102499 A1 Jun. 5, 2003

Related U.S. Application Data

(63) Continuation of application No. 10/061,320, filed on Feb. 4, 2002, now Pat. No. 6,501,133.

(30) Foreign Application Priority Data

Nov. 30, 2001 (JP) .......................................... 2001-367945

(51) Int. Cl.[7] .............................................. H01L 23/62
(52) U.S. Cl. ........................ 257/354; 257/349; 257/353
(58) Field of Search ................................. 257/347, 346, 257/349, 353, 354, 369, 387, 382; 438/149, 164, 282, 300, 412, 479, 517

(56) References Cited

U.S. PATENT DOCUMENTS

| 5,955,767 | A | 9/1999 | Liu et al. | |
|---|---|---|---|---|
| 6,100,159 | A | 8/2000 | Krivokapic | |
| 6,174,754 | B1 | 1/2001 | Lee et al. | |
| 6,403,433 | B1 * | 6/2002 | Yu et al. | 438/300 |
| 6,501,133 | B1 * | 12/2002 | Fujiwara | 257/347 |
| 6,515,333 | B1 * | 2/2003 | Riccobene | 257/347 |

* cited by examiner

Primary Examiner—Jack Chen
Assistant Examiner—Thanhha Pham
(74) Attorney, Agent, or Firm—Oblon, Spivak, McClelland, Maier & Neustadt, P.C.

(57) ABSTRACT

A semiconductor device comprising a source region, a drain region, and a buried insulating film. The buried insulating film is composed of a first part lying below the source and drain region, and a second part lying below the space between the source and drain regions. The first part of the buried insulating film is thicker than the second part. The bottoms of the source and drain regions contact the first part of the buried insulating film.

6 Claims, 7 Drawing Sheets

SOI SEMICONDUCTOR DEVICE WITH INSULATING FILM HAVING DIFFERENT PROPERTIES RELATIVE TO THE BURIED INSULATING FILM

CROSS-REFERENCE TO RELATED APPLICATIONS

This application is based upon and claims the benefit of priority from the prior Japanese Patent Application No. 2001-367945, filed Nov. 30, 2001, and U.S. patent application Ser. No. 10/061,320, filed Feb. 4, 2002, now U.S. Pat. No. 6,501,133 the entire contents of both of which are incorporated herein by reference.

BACKGROUND OF THE INVENTION

1. Field of the Invention

The present invention relates to, for example, a SOI (Silicon on Insulator) semiconductor device and a method of manufacturing the same.

2. Description of the Related Art

Recently it is demanded that semiconductor integrated circuits should operate at lower power consumption and at higher speed. It is therefore desirable to lower the power-supply voltage and make the elements smaller in each semiconductor integrated circuit. At present, SOI-type elements attract much attention, because they are superior to the bulk-type elements hitherto used, in terms of low parasitic capacitance and low sub-threshold coefficient.

If a MISFET (Metal Insulator Semiconductor FET) is made smaller, the width of its gate sidewall will decrease, regardless of the structure of the substrate. Consequently, the characteristic of the MISFET is noticeably deteriorated due to the short-channel effect. The short-channel effect can be readily controlled if the MISFET has a shallow source/drain region.

To decrease the junction capacitance and junction leakage current, it is desirable to form the MISFET in a SOI substrate and set the bottom of the source/drain region in contact with a buried insulating film. If the source/drain region is shallow, however, the layer in which the channel region is provided is proportionally thin. The MISFET inevitably becomes a fully depleted element. In any fully depleted element it is difficult to control the threshold voltage, as will be explained below in detail.

Figure 19:
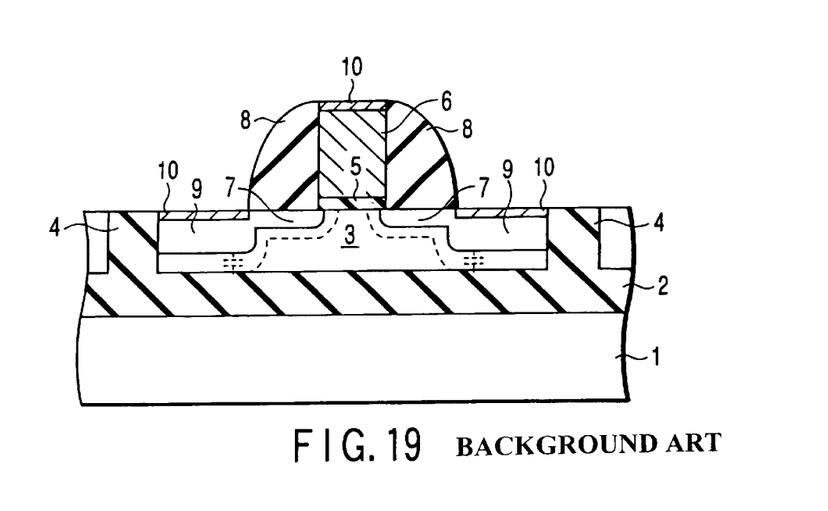
FIG. 19 is a sectional view of a general semiconductor device.
Figure 20:
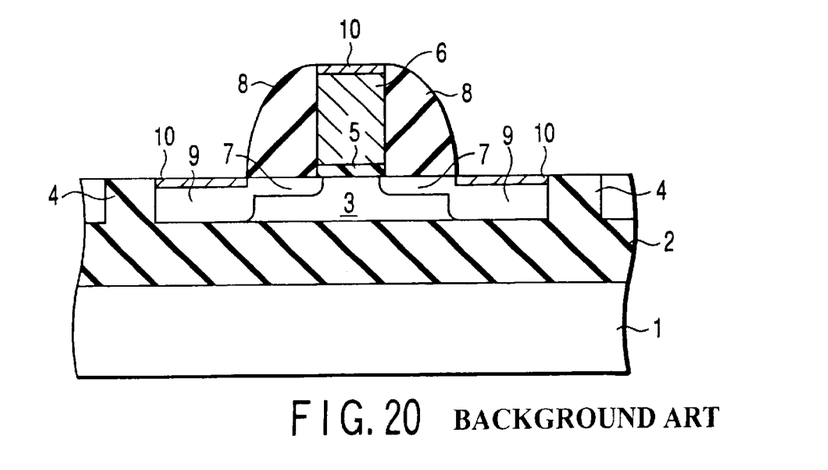
FIG. 20 is a sectional view of another semiconductor device.

FIGS. 19 and 20 show two general semiconductor devices, each formed in a SOI substrate. In FIGS. 19 and 20, the identical components are designated at the same reference numerals.

As shown in FIGS. 19 and 20, the SOI substrate comprises a silicon substrate 1, a buried insulating film (BOX: Buried Oxide) 2, and a single-crystal silicon active layer 3. The buried insulating film 2 is a silicon oxide film that is provided on the silicon substrate 1. The single-crystal silicon active layer 3 is provided on the buried insulating film 2.

As FIG. 19 shows, a gate insulating film 5 is provided on the silicon active layer 3 of the substrate 1. A gate electrode 6 is formed on the gate insulating film 5. A sidewall insulating film 8 is mounted on the sides of the gate electrode 6. A source/drain extension region 7 and a source/drain region 9 are provided in the silicon active layer 3. The regions 7 and 9 have the conductivity type opposite to that of the silicon active layer 3. Both regions 7 and 9 have been formed by implanting, for example, impurity ions into the silicon active layer 3.

The device shown in FIG. 19 is a MISFET. The MISFET is a partially depleted SOI element. In this SOI element, the silicon active layer 3 is comparatively thick. The junction between the source/drain region 9 and the silicon active layer 3 lies at a level higher than the bottom of the silicon active layer 3. Hence, a depletion layer is formed in the bottom part of the source/drain region 9, as indicated by a broken line in FIG. 19. This increases the junction capacitance. Moreover, carriers move through the trap in the depletion layer, possibly generating a leakage current.

The device shown in FIG. 20 is a fully depleted SOI element. As FIG. 20 shows, the silicon active layer 3 is so thin that the source/drain region 9 contacts the buried insulating film 2. A depletion layer is formed in that part of the silicon active layer 3 that lies below the gate electrode 6. The device is therefore a fully depleted SOI element. The threshold voltage of the fully depleted SOI element varies with the thickness of the silicon active layer 3. In view of this, it is difficult to control the threshold voltage.

BRIEF SUMMARY OF THE INVENTION

According to an aspect of the invention, there is provided a semiconductor device which comprises: an element-forming layer formed on a buried insulating film of a semiconductor substrate; a gate insulating film formed on the element-forming layer; a gate electrode formed on the gate insulating film; and a source region and a drain region formed in the element-forming layer and located on two sides of the gate electrode, respectively. The buried insulating film has a first part and a second part. The first part of the buried insulating film is located below the source and drain regions. The second part of the buried insulating film is located below the gate electrode thinner than the first part. The source and drain regions have bottoms which contact the first part of the buried insulating film.

According to another aspect of the invention, there is provided a method of manufacturing a semiconductor device, comprising: forming an element isolation region in an element-forming layer which is insulated from a semiconductor substrate by a buried insulating film; forming a masking material on a channel-forming part of the element-forming layer; implanting oxygen ions into the element-forming layer, by using the masking material; performing a heat treatment, thereby making a first part of the buried insulating film thicker, into which the oxygen ions have been implanted and which lies on the sides of the channel-forming part; removing the masking material and forming a gate insulating film on the element-forming layer; forming a gate electrode on the gate insulating film; and forming a source region and a drain region in two parts of the element-forming layer which lie on the sides of the gate electrode, respectively, the source and drain regions having bottoms which contact the first part of the buried insulating film.

DETAILED DESCRIPTION OF THE INVENTION

Embodiments of the present invention will be described, with reference to the accompanying drawings.

(First Embodiment)

Figure 1:
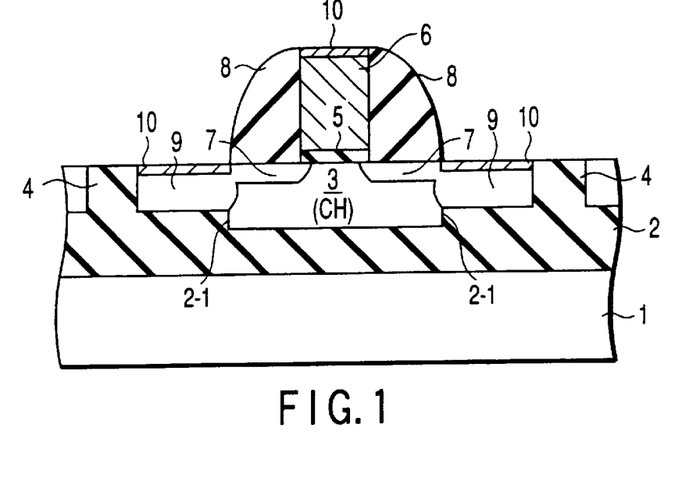
FIG. 1 is a sectional view explaining a step of manufacturing a semiconductor device according to the first embodiment of this invention.

FIG. 1 shows a semiconductor device according to the first embodiment of the present invention. A SOI substrate is provided. The SOI substrate comprises a silicon substrate 1, a buried insulating film 2, and a silicon active layer 3. The buried insulating film 2 is a silicon dioxide film provided on the silicon substrate 1. The silicon active layer 3 is made of, for example, single-crystal silicon and provided on the buried insulating film 2. An element isolation region 4, for example, STI (Shallow Trench Isolation) has been formed in the silicon active layer 3. The region 4 contacts the buried insulating film 2. The buried insulating film 2 and element isolation region 4 surround a part of the silicon active layer 3. A MISFET is provided in this part of the silicon active layer 3.

More specifically, a gate insulating film 5 has been formed on the silicon active layer 3. A gate electrode 6 is provided on the gate insulating film 5. The gate electrode 6 is made of, for example, polycrystalline silicon. A sidewall insulating film 8 has been formed on the sides of the gate electrode 6. A source/drain extension region 7 is provided in the silicon active layer 3 and self-aligned with the gate electrode 6. A source/drain region 9 is provided in the silicon active layer 3 and self-aligned with the sidewall insulating film 8. The regions 7 and 9 are of the conductivity type opposite to that of the silicon active layer 3. The source/drain extension region 7 has an impurity concentration that is lower than that of the source/drain region 9. A silicide film 10 is formed on the gate electrode 6 and the source/drain region 9.

That part of the buried insulating film 2 which lies below the channel region of the MISFET is thinner than the other part. Hence, that part of the silicon active layer 3 which serves as the channel region can have a sufficient thickness. The bottom of the source/drain region 9 contacts the thicker part 2-1 of the buried insulating film 2.

A method of manufacturing the MISFET having the structure described above will be explained, with reference to FIGS. 2 to 6.

Figure 2:
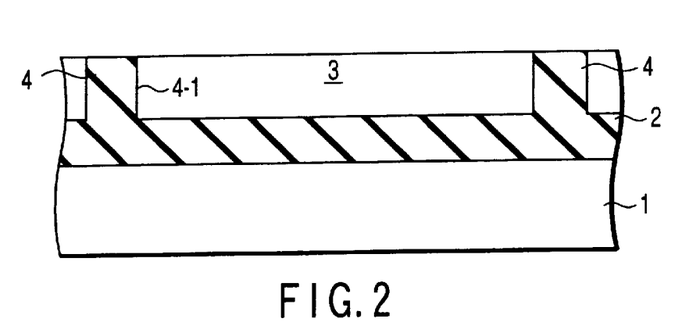
FIG. 2 is a sectional view illustrating the step that follows the step explained with reference to FIG. 1.

As FIG. 2 shows, an element isolation region 4 is formed in the silicon active layer 3 of a SOI substrate. At first, a trench 4-1 is made in the surface of the silicon active layer 3, exposing the buried insulating film 2 of the SOI substrate. Then, a silicon oxide film, for example, is deposited on the entire silicon active layer 3, filling the trench 4-1. The silicon oxide film is subjected to, for example, CMP (Chemical Mechanical Polishing). The silicon oxide film is thereby removed, except that part filled in the trench 4-1. Thus, the element isolation region 4 is formed in the active silicon layer 3. The method of forming the element isolation region 4 is not limited to the STI, nor is the structure of the element isolation region 4 limited to that of the STI. Rather, the element isolation region 4 may be formed by LOCOS.

A masking material is deposited on the silicon active layer 3. The masking material is, for example, a silicon nitride film. The masking material is first patterned and is then removed, except a part that lies on the channel forming region.

Figure 3:
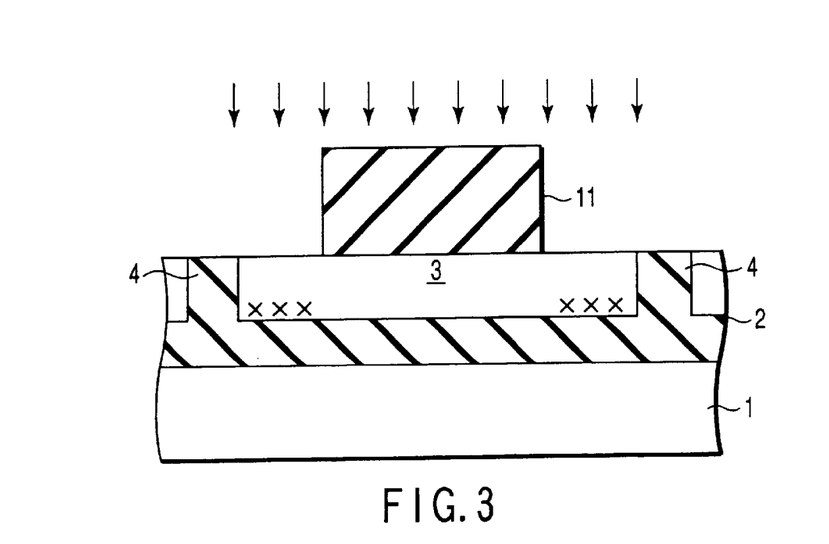
FIG. 3 is a sectional view explaining the step that follows the step explained with reference to FIG. 2.

FIG. 3 illustrates the patterned masking material 11 formed on the channel-forming region. Using said patterned masking material 11, oxygen ions are implanted into the silicon active layer 3 as shown in FIG. 3. The ion implantation is performed at such an acceleration voltage that the oxygen ions reach a region near the buried insulating film 2. The oxygen ions are implanted in such a dose that a silicon dioxide film to be formed after heat treatment have the same characteristic as the buried silicon dioxide film. To be more specific, the acceleration voltage is, for example, 20 to 30 keV, and the dose is, for example, $5 \times 10^{17}$ cm$^{-2}$ to $1 \times 10^{18}$ cm$^{-2}$.

Figure 4:
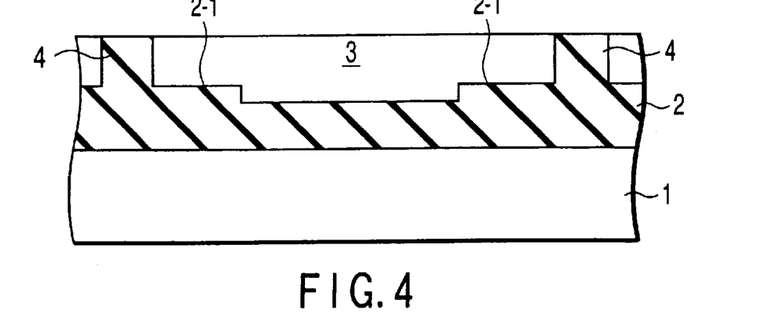
FIG. 4 is a sectional view depicting the step that follows the step explained with reference to FIG. 3.

As FIG. 4 shows, the patterned masking material 11 is removed. The resultant structure is heat-treated, whereby that part of the buried insulating film 2 into which oxygen has been ion-implanted becomes thicker, forming a thick part 2-1. Namely, said part of the buried insulating film 2 is thicker than the other part that will lie below the channel region of the MISFET. Then, impurities (not shown) are introduced into the silicon active layer 3 in order to adjust the threshold voltage of the MISFET.

Figure 5:
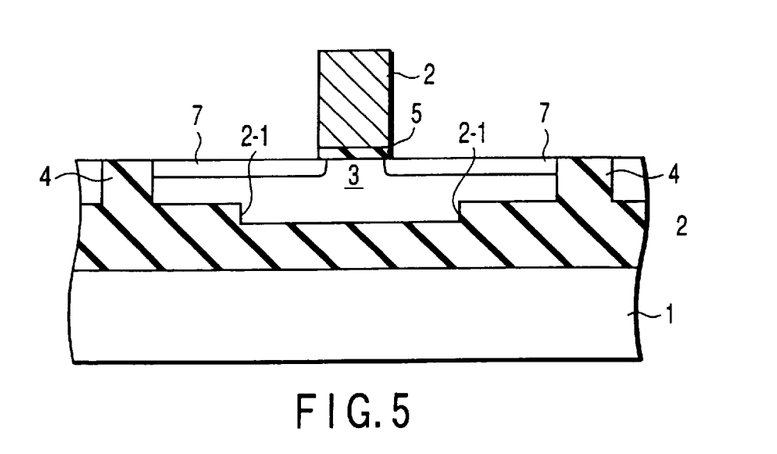
FIG. 5 is a sectional view explaining the step that follows the step explained with reference to FIG. 4.

As FIG. 5 shows, a gate insulating film 5 is formed on the silicon active layer 3. The gate insulating film 5 is, for example, a silicon oxynitride film. Thereafter, a polycrystalline silicon film is deposited on the gate insulating film 5, forming a gate electrode 6. Using the gate electrode 6 as mask, impurities are introduced into the silicon active layer 3, forming a source/drain extension region 7. The conductivity type of this region 7 is opposite to that of the silicon active layer 3. The dose of the impurities in the source/drain extension region 7 is, for example, $5 \times 10^{14}$ cm$^{-2}$.

An insulating film is deposited on the resultant structure. The insulating film is, for example, a silicon nitride film. The insulating film is subjected to RIE (Reactive Ion Etching).

Figure 6:
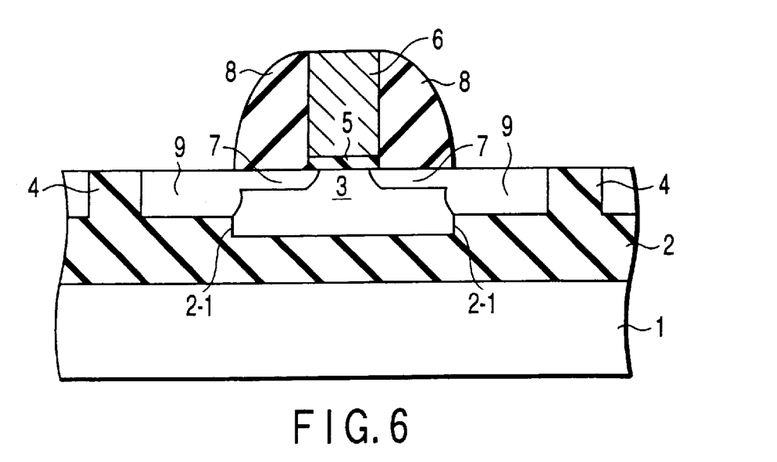
FIG. 6 is a sectional view depicting the step that follows the step explained with reference to FIG. 5.

As a result, as shown in FIG. 6, a sidewall insulating film 8 is formed on the sides of the gate electrode 6. Using the sidewall insulating film 8 as mask, impurities are ion-implanted into the silicon active layer 3. A source/drain region 9 is thereby formed in the silicon active layer 3. The source/drain region 9 contacts the thicker part 2-1 of the buried insulating film 2. The dose of the impurities in the source/drain region 9 is, for example, $5 \times 10^{15}$ cm$^{-2}$.

A film of metal such as Co, Ni or Ti is deposited on the resultant structure by means of sputtering. The structure is then heat-treated. A metal silicide film 10 is thereby formed on the gate electrode 6 and the source/drain region 9 as is illustrated in FIG. 1.

Thereafter, an inter-layer insulating film (not shown) is deposited on the resultant structure. Contact holes are made in the inter-layer insulating film, exposing some parts of the metal silicide film 10. The contact holes are filled with, for example, tungsten, forming wires that are connected to the gate electrode 6 and the source/drain region 9. The MISFET of the structure shown in FIG. 1 is thus manufactured.

In the first embodiment described above, the two parts of the buried insulating film 2, which lie below the source/drain region 9 and the channel region CH differ in thickness. More specifically, the part that lies below the source/drain region 9 is thicker than the part that lies below the channel region CH. The bottom of the source/drain region 9 can therefore contact the buried insulating film 2, without being made deeper. Relatively shallow, the source/drain region 9 can suppress short-channel effect. Since no depletion layers are formed in the bottom of the source/drain region 9, the junction capacitance and the junction leakage current can be reduced.

In addition, that part of the silicon active layer 3 that serves as channel region CH can have a sufficient thickness. Therefore, the MISFET has a partially depleted SOI structure, and its threshold voltage can be reliably controlled.

Further, the potential of the silicon active layer 3 is floating. The substrate floating effect can improve the on-off ratio of the transistor.

The ion implantation of oxygen is carried out and the annealing is performed to eliminate defects, before the impurities are introduced to form the element. Therefore, the substrate can be heated sufficiently. The defects caused by the ion implantation can, therefore, be eliminated. This makes it possible to form a buried insulating film of high quality.

(Second Embodiment)

The semiconductor device according to the second embodiment of the invention is identical to the first embodiment in terms of structure. It is manufactured by a different method.

Figure 7:
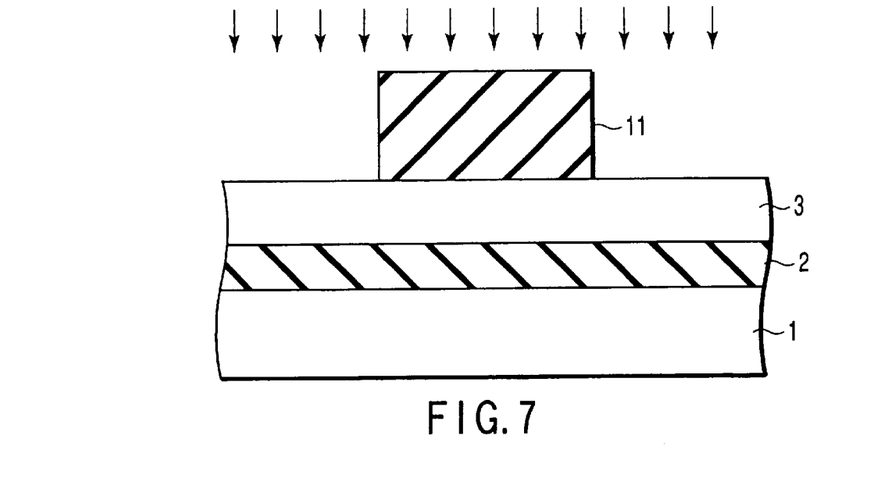
FIG. 7 is a sectional view explaining a step of manufacturing a semiconductor device according to the second embodiment of the invention.
Figure 8:
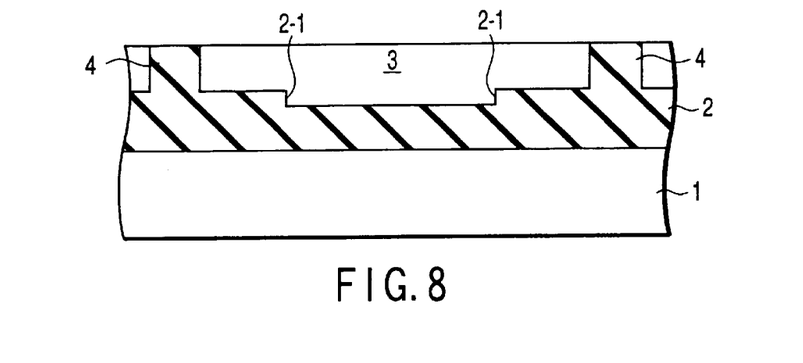
FIG. 8 is a sectional view depicting the step that follows the step explained with reference to FIG. 7.

A method of manufacturing a MISFET according to the second embodiment will be described, with reference to FIGS. 7 and 8. In FIGS. 7 and 8, the components identical or similar to those of the first embodiment are designated at the same reference numerals.

As FIG. 7 shows, a masking material is deposited on the silicon active layer 3 of a SOI substrate. The masking material is patterned. The part of the masking material, other than the part that will be a channel region, is thereby removed. Using the patterned masking material 11 as mask, oxygen is ion-implanted into the silicon active layer 3.

As FIG. 8 shows, the patterned masking material 11 is removed. Heat treatment is performed on the resultant structure, increasing the thickness of that part of the layer 3 into which oxygen ions have been implanted. An element isolation region 4 is then formed in the same way as in the first embodiment.

Thereafter, the same manufacturing steps are performed as in the first embodiment. A gate insulating film 5 is thereby formed on the silicon active layer 3, and a gate electrode 6 is formed on the gate insulating film 5. Using the gate electrode 6 as mask, impurities are introduced into the silicon active layer 3, forming a source/drain extension region 7. A sidewall insulating film 8 is then formed on the sides of the gate electrode 6. Using the sidewall insulating film 8 as mask, impurities are introduced into the silicon active layer 3, forming a source/drain region 9. Then, a metal silicide film 10 is formed on the gate electrode 6 and the source/drain region 9. The MISFET is thus manufactured.

In the second embodiment, annealing is performed at high temperature for a long time, thus eliminating defects, and the element isolation region 4 is then formed. This minimizes the stress in the element-forming layer. The defects can therefore be reliably eliminated in the element-forming layer. Moreover, the junction leakage current and the junction capacitance can be decreased.

(Third Embodiment)

The semiconductor device according to the third embodiment of the invention is identical to the first embodiment in terms of structure. It is manufactured by a different method.

A method of manufacturing a MISFET according to the third embodiment will be described, with reference to FIGS. 9 to 13. In FIGS. 9 to 13, the components identical or similar to those of the first embodiment are designated at the same reference numerals.

Figure 9:
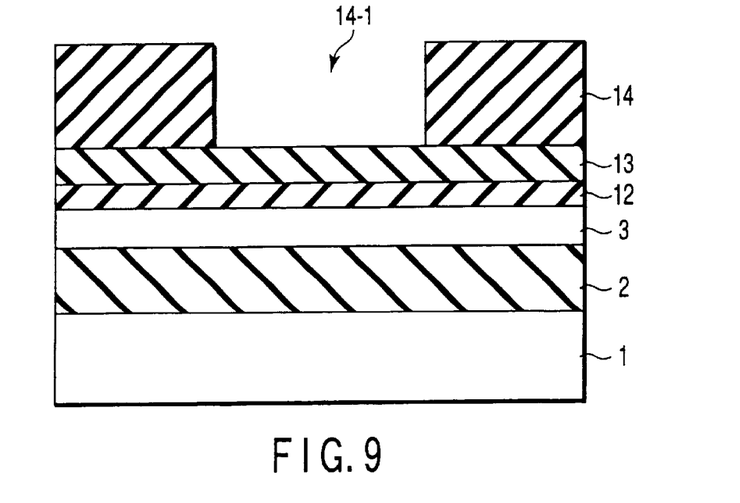
FIG. 9 is a sectional view explaining a step of manufacturing a semiconductor device according to the third embodiment of the invention.

As FIG. 9 shows, a silicon dioxide film 12, for example, is formed on the silicon active layer 3 of a SOI substrate. An insulating film is deposited on the silicon dioxide film 12. The insulating film is, for example, a silicon nitride film 13 that differs in each ratio from the silicon dioxide film 12. A photoresist 14 is formed on the silicon nitride film 13. The photoresist 14 has an opening 14-1 that serves to form a channel region. Using the photoresist 14 as mask, RIE is performed on the silicon nitride film 13, silicon dioxide film 12, silicon active layer 3 and buried insulating film 2. Thus, those parts of the films 13, 12 and 2 and layer 3, which correspond to the channel region, are removed. Then, the photoresist 14 is removed.

Figure 10:
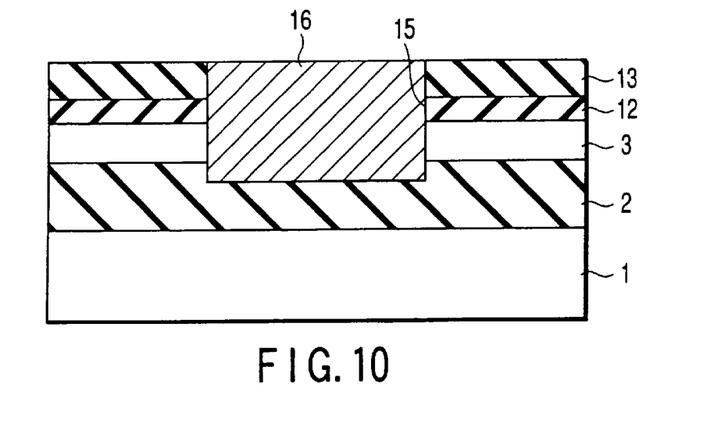
FIG. 10 is a sectional view depicting the step that follows the step explained with reference to FIG. 9.

An opening 15 is thereby formed as is illustrated in FIG. 10. The degree of etching the buried insulating film 2 is controlled, adjusting the thickness of that part of the film 2 that lies below the channel region. Then, as FIG. 10 shows, a single-crystal silicon layer 16 is formed in the opening 15 by means of, for example, selective epitaxial growth.

Figure 11:
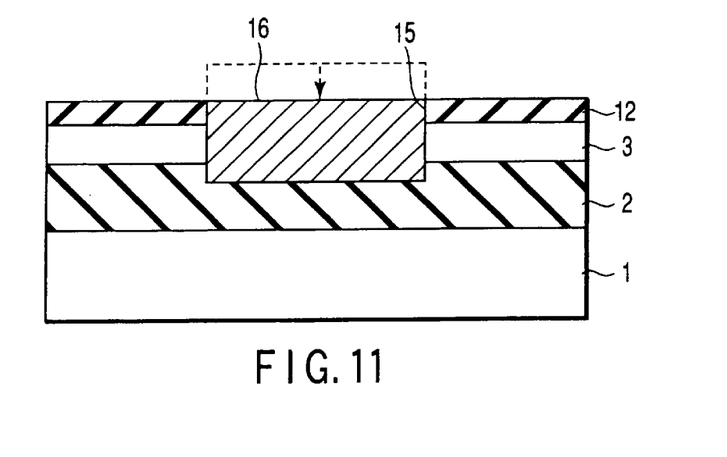
FIG. 11 is a sectional view depicting the step that follows the step explained with reference to FIG. 10.

As FIG. 11 shows, the silicon nitride film 13 is removed. Using the silicon dioxide film 12 as stopper, CMP is performed, polishing the single-crystal silicon layer 16.

Figure 12:
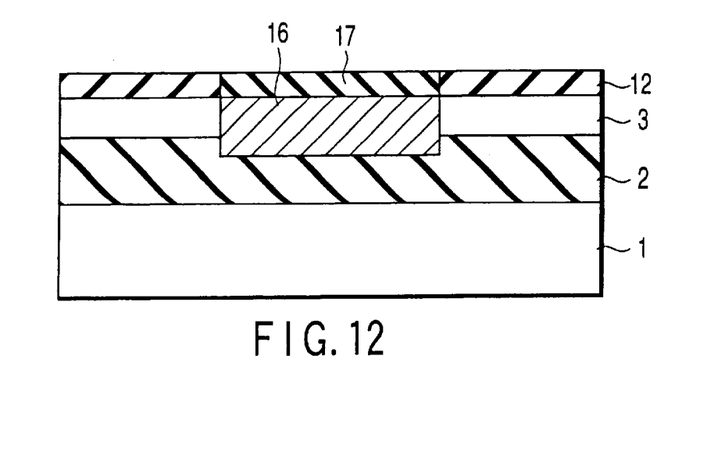
FIG. 12 is a sectional view depicting the step that follows the step explained with reference to FIG. 11.

As shown in FIG. 12, the upper surface region of the silicon layer 16 is oxidized, forming a silicon oxide film 17. The oxidation adjusts the thickness of that part of the silicon layer 16 that will serve as the channel region.

Figure 13:
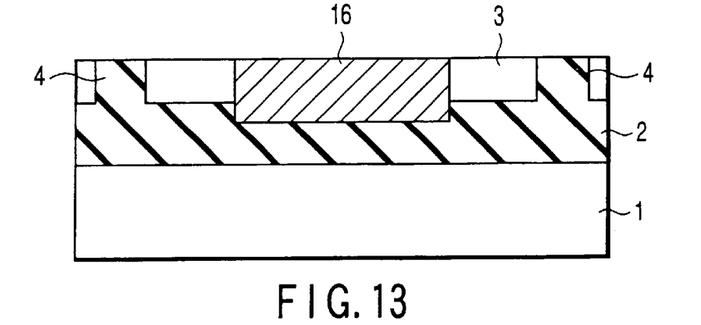
FIG. 13 is a sectional view depicting the step that follows the step explained with reference to FIG. 12.

As FIG. 13 shows, the silicon dioxide films 12 and 17 are removed from the silicon active layer 3 and the silicon layer 16, respectively. An element isolation region 4 is formed in the silicon active layer 3. The region 4 is of the same type as those provided in the first and second embodiments.

Thereafter, the same manufacturing steps are performed as in the first embodiment. The MISFET is thereby manufactured.

In the third embodiment, etching is carried out, adjusting the channel region (single-crystal silicon layer 16) and the buried insulating film 2 in terms of thickness. This reduces the possibility of crystal defects to a greater degree than is possible in the first and second embodiments.

In the third embodiment, it is unnecessary to perform heat treatment for a long time to provide a sufficiently thick, buried silicon dioxide film. The MISFET according to the third embodiment can therefore be manufactured at lower cost than the MISFETs according to the first and second embodiments.

In the third embodiment, the element isolation region 4 is formed after the single-crystal silicon layer 16 is formed. Nonetheless, the timing of forming the region 4 is not limited to this.

Figure 14:
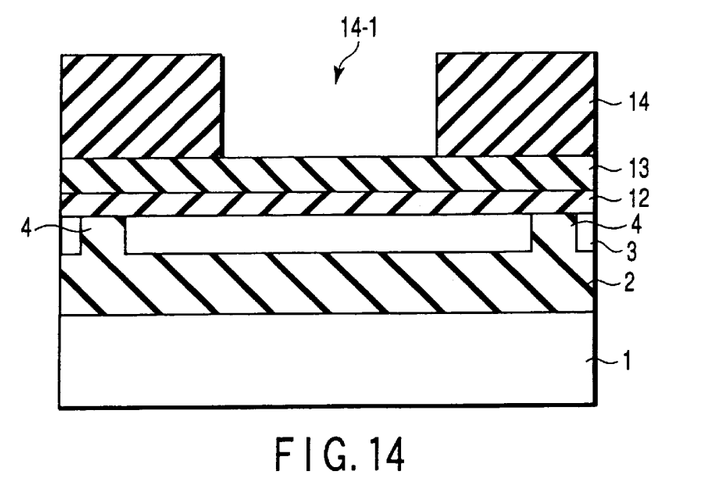
FIG. 14 is a sectional view illustrating a modification of the third embodiment.

FIG. 14 illustrates a modification of the third embodiment. In the modified embodiment, an element isolation region 4 is formed before a silicon dioxide film 12, silicon nitride film 13 and photoresist 14 are formed, one upon another in the order mentioned, on the silicon active layer 3.

Thereafter, the same manufacturing steps are carried out as in the third embodiment. The modified embodiment can achieve the same advantages as the third embodiment.

(Fourth Embodiment)

A method of manufacturing a MISFET according to the fourth embodiment of the invention will be described, with reference to FIGS. 15 to 18. In FIGS. 15 to 18, the components identical or similar to those of the first to third embodiments are designated at the same reference numerals.

Figure 15:
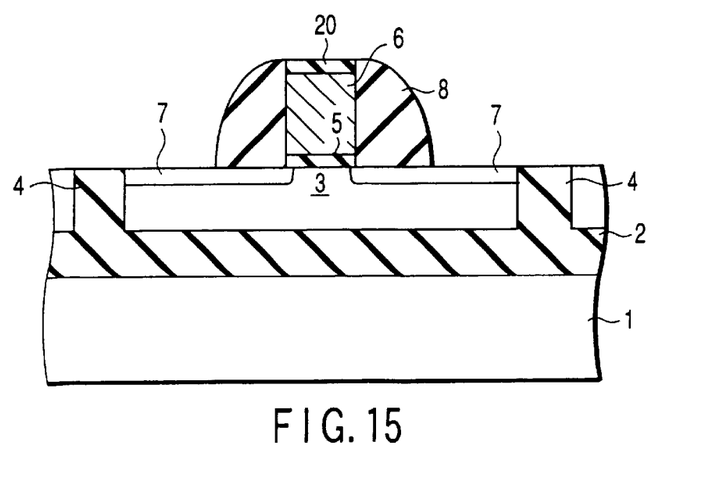
FIG. 15 is a sectional view explaining a step of manufacturing a semiconductor device according to the fourth embodiment of the invention.

At first, as shown in FIG. 15, an element isolation region 4 is formed in the silicon active layer 3 of a SOI substrate, in the same way as in the first and second embodiment. Next, a gate insulating film 5 is formed on the silicon active layer 3. A gate electrode 6 made of, for example, polycrystalline silicon, is formed on the gate insulating film 5. A gate cap 20, which is, for example, a silicon nitride film, is formed on the gate electrode 6. The film 5, electrode 6 and gate cap 20 are formed by the methods known in the art. Using the gate cap 20 as mask, impurities are ion-implanted into the silicon active layer 3, forming a source/drain extension region 7. The conductivity type of the region 7 is opposite to that of the silicon active layer 3. Further, a sidewall insulating film 8 is formed on the sides of the gate electrode 6.

Figure 16:
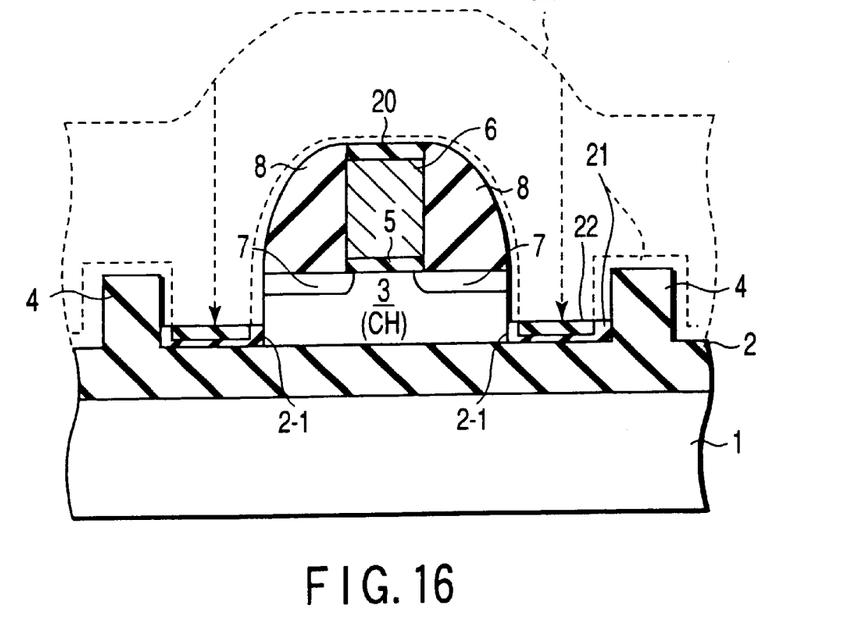
FIG. 16 is a sectional view depicting the step that follows the step explained with reference to FIG. 15.

As FIG. 16 shows, the silicon active layer 3 is etched in self-alignment by, for example, RIE, using the sidewall insulating film 8, gate cap 20 and element isolation region 4 as mask. A buried insulating film 2 is thereby exposed.

A silicon nitride film 21, for example, is deposited on the resultant structure. The film 21 has high etch selectivity to those of the element isolation region 4 and sidewall insulating film 8. Further, a silicon dioxide film 22 is deposited on the silicon nitride film 21. The silicon dioxide film 22 is made flat at the surface and then etched back. The silicon nitride film 21 is subjected to selective etching, whereby the sides of the silicon active layer 3 are exposed. At this time, a part of the silicon nitride film 21 remains on the buried insulating film 2, and a part of the silicon dioxide film 22 remains on said part of the silicon nitride film 21. As a result, a thick film 2-1 is formed, which is composed of the parts of the films 21 and 22.

Figure 17:
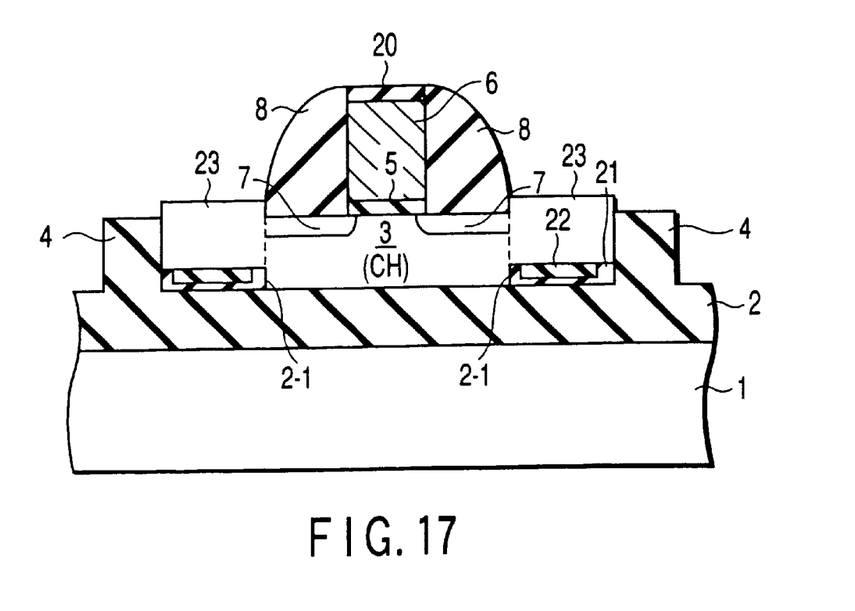
FIG. 17 is a sectional view depicting the step that follows the step explained with reference to FIG. 16.

As FIG. 17 shows, selective growth of silicon is carried out, forming, for example, an epitaxial silicon layer 23 on the silicon nitride film 21 and the silicon dioxide film 22. The silicon active layer 3 is used as seed in the process of growing the epitaxial silicon layer 23. If the conditions of this process are optimized, an elevated source/drain structure will be obtained. That is, the surface of the epitaxial silicon layer 23 will be at a level a slightly higher than the surface of the silicon active layer 3.

Figure 18:
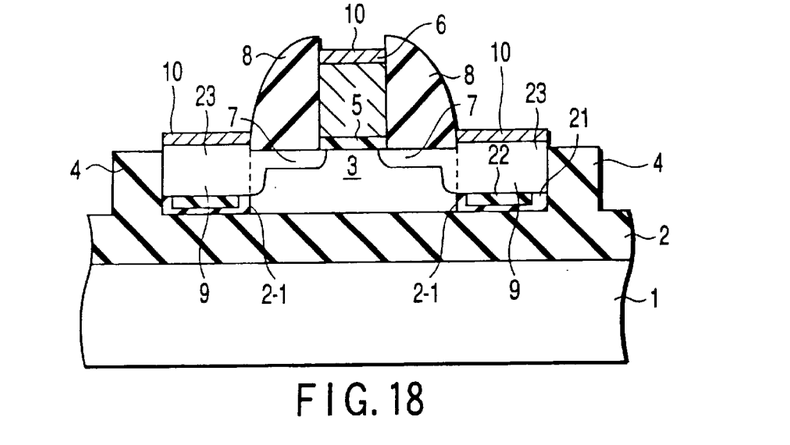
FIG. 18 is a sectional view depicting the step that follows the step explained with reference to FIG. 17.

As FIG. 18 shows, the gate cap 20 is removed. Thereafter, impurities are ion-implanted into the epitaxial silicon layer by using the sidewall insulating film 8 as mask. A source/drain region 9 is thereby formed, which is of the conductivity type opposite to that of silicon active layer 3. A metal silicide film 10 is formed on the source/drain region 9 and the gate electrode 6. Thus, the MISFET is manufactured.

In the fourth embodiment, the silicon active layer 3 is etched by using the sidewall insulating film 8 as mask, thereby exposing the buried insulating film 2. Then, the silicon nitride film 21 and silicon dioxide film 22 are formed on the buried insulating film 2, increasing the thickness of that part of the film 2 which lies outside the channel region. Hence, the buried insulating film 2 can comprise two parts different in thickness, one of which lies below the channel region.

Since in the fourth embodiment, the epitaxial silicon layer 23, which is processed to become the source/drain region 9, is formed on the silicon nitride film 21 and the silicon dioxide film 22, the bottom of the source/drain region 9 therefore contacts the buried insulating film 2. This decreases the junction capacitance and junction leakage current in the MISFET.

Moreover, the silicon active layer 3 has a sufficient thickness in the fourth embodiment, thus providing a partially depleted SOI element. The threshold voltage of the MISFET can therefore be easily controlled.

Further, the fourth embodiment can have an elevated source/drain structure. Thus, the source/drain region can have a shallow junction with respect to the channel region, while maintaining a constant distance between the silicide-silicon interface and the buried insulating film. This helps to reduce the short-channel effect.

Additionally, the element-forming layer in the source/drain region and the buried insulating film can be adjusted in term of thickness. Hence, photolithography need not be performed in order to define the channel region. The number of steps of manufacturing the MISFET can therefore be decreased.

An elevated source/drain structure is formed in the fourth embodiment. Therefore, the source and the drain can be sufficiently thick even if the source/drain region formed in the silicon active layer 3 is relatively thin. This reduces the parasitic resistance in the source/drain region and, consequently, increasing the drive current.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

an element-forming layer formed on a buried insulating film of a semiconductor substrate;

a gate insulating film formed on the element-forming layer;

a gate electrode formed on the gate insulating film;

a source region and a drain region formed in the element-forming layer, corresponding to two sides of the gate electrode, respectively, and lying at a level higher than a surface of the element-forming layer; and an insulating film distinct from the buried insulating film and formed on a first part of the buried insulating film, which lies below the source and drain regions, said insulating film contacting bottom surfaces of the source and drain regions, wherein the element-forming layer has a first part and a second part, the first part of the element-forming layer corresponds to the source and drain regions, the second part of the element-forming layer is located below the gate electrode and is thicker than the first part, and the source and drain regions have bottom surfaces that contact the insulating film.

2. The device according to claim 1, wherein the second part of the element-forming layer forms a partially depleted element.

3. The device according to claim 2, wherein the element-forming layer has a floating potential.

4. The device according to claim 1, further comprising:

an extension region formed in parts of the element-forming layer that lie on sides of the gale electrode, respectively, connected to the source and drain regions and having an impurity concentration lower than that of the source and drain regions; and a sidewall insulating film formed on the sides of the gate electrode and lying above the source and drain regions.

5. The device according to claim 1, wherein said insulating film includes a silicon nitride film and a silicon dioxide film.

6. The device according to claim 1, wherein the insulating film is different than the buried insulating film in a chemical composition.

* * * * *